US011037758B2

(12) United States Patent
Anglin et al.

(10) Patent No.: US 11,037,758 B2
(45) Date of Patent: Jun. 15, 2021

(54) IN-SITU PLASMA CLEANING OF PROCESS CHAMBER COMPONENTS

(71) Applicant: Varian Semiconductor Equipment Associates, Inc., Gloucester, MA (US)

(72) Inventors: Kevin Anglin, Somerville, MA (US); William Davis Lee, Newburyport, MA (US); Peter Kurunczi, Cambridge, MA (US); Ryan Downey, Gloucester, MA (US); Jay T. Scheuer, Rowley, MA (US); Alexandre Likhanskii, Malden, MA (US); William M. Holber, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/724,944

(22) Filed: Dec. 23, 2019

(65) Prior Publication Data
US 2020/0126757 A1   Apr. 23, 2020

Related U.S. Application Data

(62) Division of application No. 14/820,747, filed on Aug. 7, 2015, now Pat. No. 10,522,330.
(Continued)

(51) Int. Cl.
*C23C 16/44*   (2006.01)
*H01J 37/317*   (2006.01)
(Continued)

(52) U.S. Cl.
CPC ........ *H01J 37/3171* (2013.01); *H01J 37/241* (2013.01); *H01J 37/32862* (2013.01);
(Continued)

(58) Field of Classification Search
None
See application file for complete search history.

(56) References Cited

U.S. PATENT DOCUMENTS

| 5,012,094 A * | 4/1991 | Hamade | ............. | G03G 15/0291 |
| | | | | 250/324 |
| 5,554,854 A | 9/1996 | Blake | | |

(Continued)

FOREIGN PATENT DOCUMENTS

| JP | 63020450 A | 1/1988 |
| JP | 2002213039 A | 7/2002 |

(Continued)

OTHER PUBLICATIONS

International Search Report and Written Opinion for the International Patent Application No. PCT/US2016/035418, dated Sep. 2, 2016, 10 pages.

*Primary Examiner* — Allan W. Olsen
(74) *Attorney, Agent, or Firm* — Kacvinsky Daisak Bluni PLLC

(57) ABSTRACT

Provided herein are approaches for in-situ plasma cleaning of ion beam optics. In one approach, a system includes a component (e.g., a beam-line component) of an ion implanter processing chamber. The system further includes a power supply for supplying a first voltage and first current to the component during a processing mode and a second voltage and second current to the component during a cleaning mode. The second voltage and current are applied to one or more conductive beam optics of the component, individually, to selectively generate plasma around one or more of the one or more conductive beam optics. The system may further include a flow controller for adjusting an injection rate of an etchant gas supplied to the beam-line
(Continued)

component, and a vacuum pump for adjusting pressure of an environment of the beam-line component.

16 Claims, 8 Drawing Sheets

Related U.S. Application Data

(60) Provisional application No. 62/174,906, filed on Jun. 12, 2015.

(51) Int. Cl.
*H01J 37/32* (2006.01)
*H01J 37/24* (2006.01)
*H01J 37/34* (2006.01)
*B08B 7/00* (2006.01)

(52) U.S. Cl.
CPC ......... *H01J 37/3467* (2013.01); *B08B 7/0035* (2013.01); *H01J 2237/022* (2013.01); *H01J 2237/049* (2013.01); *H01J 2237/04756* (2013.01); *H01J 2237/057* (2013.01); *H01J 2237/334* (2013.01); *H01J 2237/335* (2013.01)

(56) References Cited

U.S. PATENT DOCUMENTS

| | | | |
|---|---|---|---|
| 5,578,821 A * | 11/1996 | Meisberger | H01J 37/28 250/310 |
| 5,633,506 A | 5/1997 | Blake | |
| 6,221,169 B1 | 4/2001 | Bernstein et al. | |
| 6,715,496 B2 | 4/2004 | Kwan et al. | |
| 6,992,311 B1 | 1/2006 | Ring et al. | |
| 7,531,819 B2 | 5/2009 | DiVergilio et al. | |
| 7,629,590 B2 | 12/2009 | Horsky et al. | |
| 7,888,662 B2 | 2/2011 | Biloiu et al. | |
| 7,947,129 B2 | 5/2011 | Murata et al. | |
| 8,921,811 B2 * | 12/2014 | Toth | H01J 37/3056 250/492.1 |
| 9,368,314 B2 * | 6/2016 | Nakasuji | H01J 29/70 |
| 9,406,480 B2 * | 8/2016 | Noji | H01J 37/20 |
| 9,761,410 B2 | 9/2017 | Likhanskii et al. | |
| 10,840,054 B2 * | 11/2020 | Platzgummer | H01J 37/3177 |
| 2006/0081564 A1 | 4/2006 | Moroz et al. | |
| 2006/0086376 A1 | 4/2006 | Dimeo et al. | |
| 2006/0272776 A1 | 12/2006 | Horsky et al. | |
| 2007/0108395 A1 | 5/2007 | Horsky et al. | |
| 2007/0241689 A1 | 10/2007 | Horsky et al. | |
| 2007/0242689 A1 | 10/2007 | Zavadsky et al. | |
| 2011/0008578 A1 | 1/2011 | Yamane et al. | |
| 2011/0053360 A1 | 3/2011 | Porshnev et al. | |
| 2012/0168637 A1 | 7/2012 | Radovanov et al. | |
| 2014/0041684 A1 | 2/2014 | Kurunczi et al. | |
| 2015/0101634 A1 | 4/2015 | Leavitt et al. | |
| 2018/0166261 A1 | 6/2018 | Anglin et al. | |

FOREIGN PATENT DOCUMENTS

| | | |
|---|---|---|
| JP | 2008518482 A | 5/2008 |
| JP | 2014506385 A | 3/2014 |
| JP | 63020450 | 6/2018 |
| TW | 201407655 A | 2/2014 |
| WO | 2014175702 A1 | 10/2014 |

\* cited by examiner

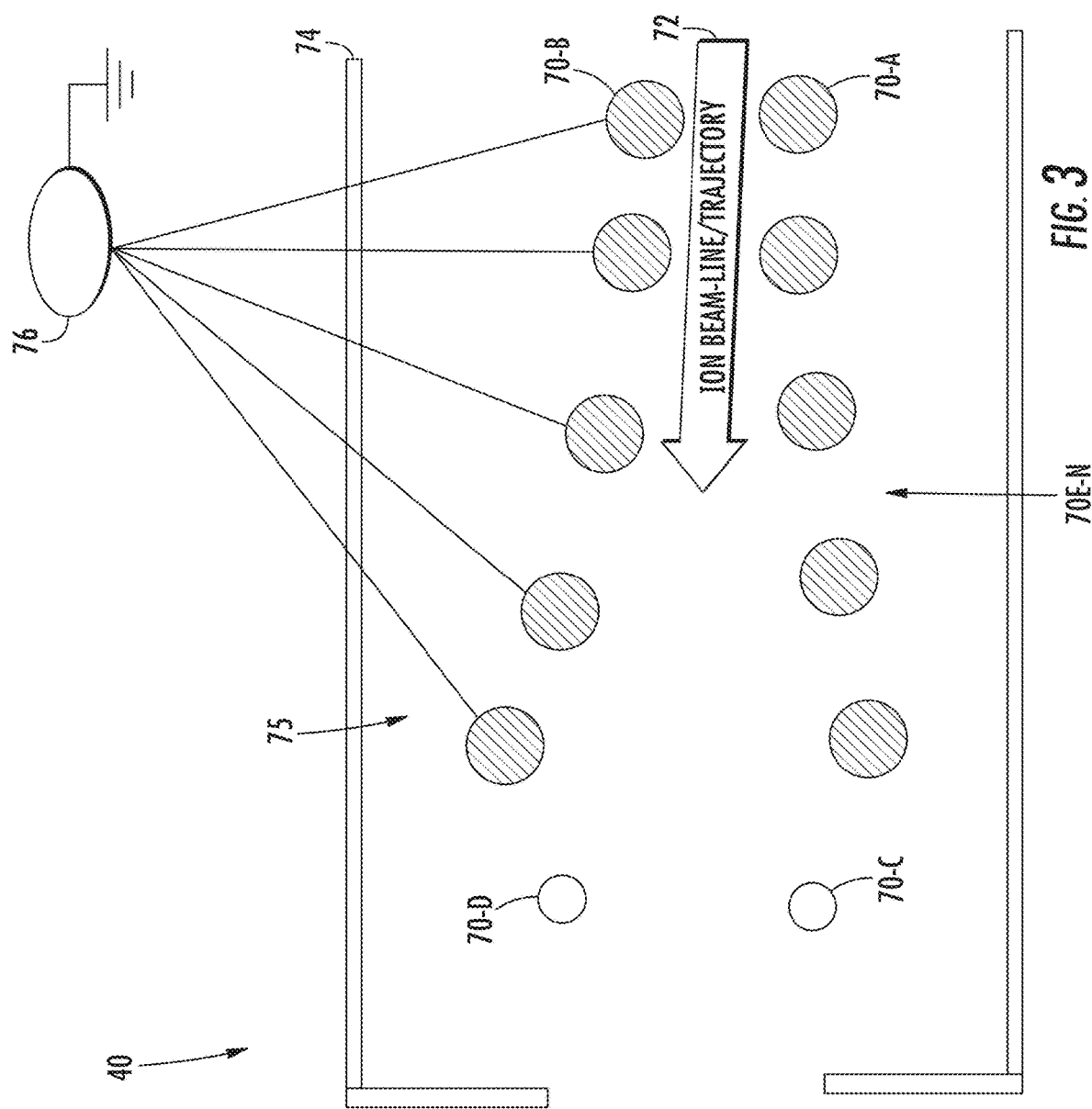

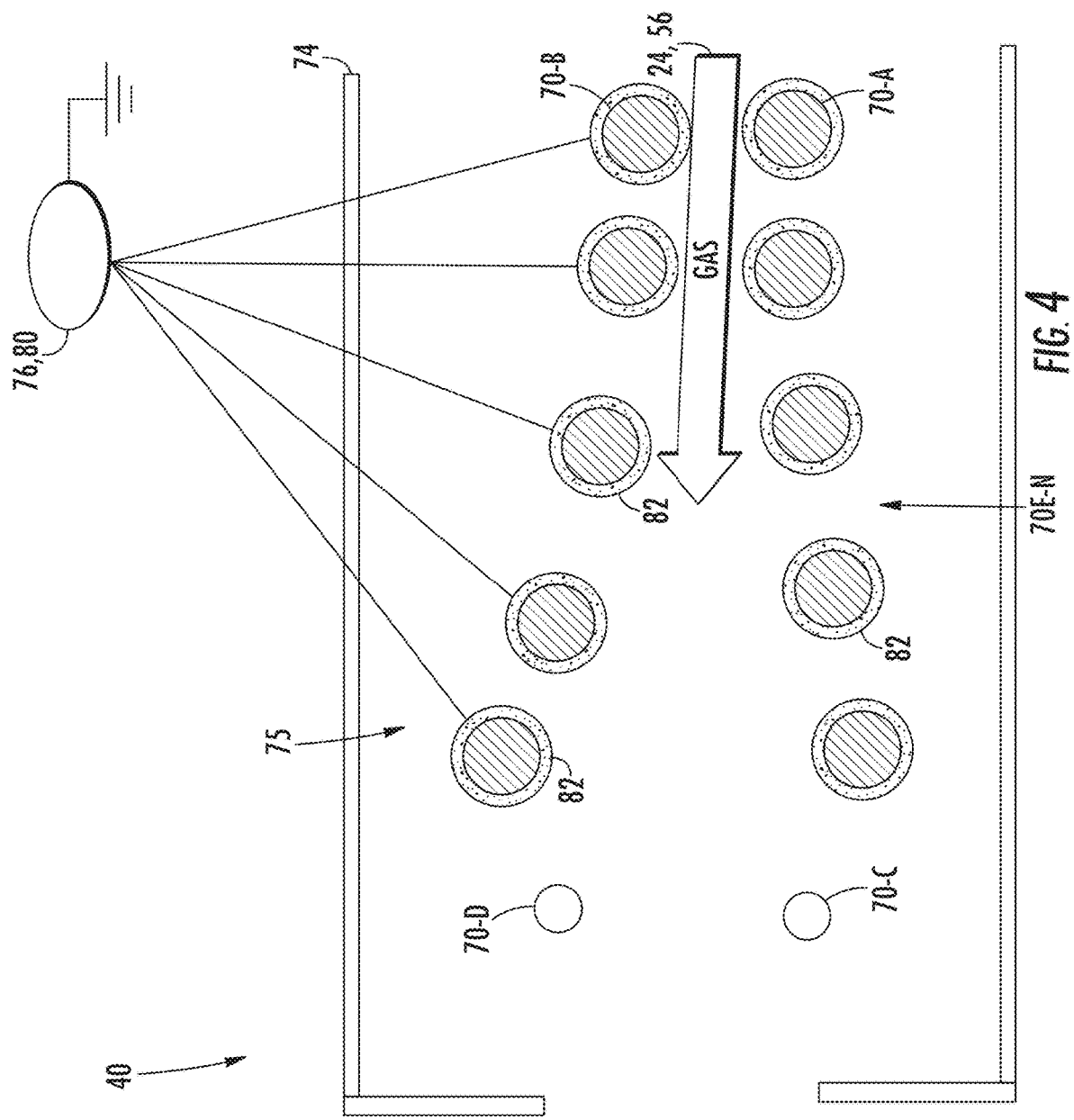

IN-SITU PLASMA CLEANING OF PROCESS CHAMBER COMPONENTS

CROSS-REFERENCE TO RELATED APPLICATIONS

This is a divisional of pending U.S. non-provisional patent application Ser. No. 14/820,747, filed Aug. 7, 2015, which claims priority to U.S. provisional patent application Ser. No. 62/174,906, filed Jun. 12, 2015, the entire contents of the applications incorporated by reference herein.

FIELD OF THE DISCLOSURE

The disclosure relates generally to techniques for manufacturing electronic devices, and more particularly, to techniques for improving the performance and extending the lifetime of components within a processing chamber.

BACKGROUND OF THE DISCLOSURE

Ion implantation is a process by which dopants or impurities are introduced into a substrate via bombardment. In semiconductor manufacturing, the dopants are introduced to alter electrical, optical, or mechanical property. For example, dopants may be introduced into an intrinsic semiconductor substrate to alter the type and level of conductivity of the substrate. In manufacturing an integrated circuit (IC), a precise doping profile is often important for proper IC performance. To achieve a desired doping profile, one or more dopants may be implanted in the form of ions in various doses and various energy levels.

A conventional ion implantation system may comprise an ion source and a series of beam-line components through which an ion beam passes. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses that manipulate a light beam, the beam-line components can filter, focus, and manipulate ions or ion beam having desired species, shape, energy, and other qualities. The ion beam that passes through the beam-line components may be directed toward a substrate that is mounted on a platen or clamp. The substrate may be moved in one or more dimensions (e.g., translate, rotate, and tilt) by an apparatus, sometimes referred to as a roplat. It should be appreciated by those skilled in the art that the entire path traversed by the ion beam is typically evacuated during ion implantation.

The ion implanter system is required to generate a stable, well-defined ion beam for a variety of different ion species and extraction voltages. It is therefore desirable to operate the ion source for extended periods of time without the need for maintenance or repair. After several hours of normal operation using source gases (such as $AsH_3$, $PH_3$, $BF_3$, and other species), beam constituents eventually create deposits on beam optics. Beam optics within a line-of-sight of the wafer also become coated with residues from the wafer, including Si and photoresist compounds. These residues build up on the beam-line components, causing spikes in the DC potentials during normal operation (e.g., in the case of electrically biased components) and eventually flake off, causing increased particulate contamination to be transferred to the wafer.

One way to prevent the effect of the material accumulation is to intermittently replace beam-line components of the ion implanter system. Alternatively, beam-line components may be manually cleaned. However, these measures require the ion source or the entire ion implanter system to be powered down and to release the vacuum within the system. Moreover, the ion implanter system, after replacing or cleaning the beam-line components, must be powered and evacuated to reach operational condition. Accordingly, these maintenance processes may be very time consuming. In addition, the beam-line component is not used during the maintenance processes. As such, frequent maintenance processes may decrease the time available for IC production, while increasing overall manufacturing cost.

SUMMARY

In view of the foregoing, it would be advantageous to provide a system and method for in-situ plasma cleaning of ion beam-line components (e.g., ion beam optics), wherein the in-situ plasma cleaning may be performed over a short time and without having to vent and/or manually clean the ion beam optics. Moreover, it would be advantageous to provide a system and method for in-situ plasma cleaning of ion beam optics wherein a plasma is locally generated in an area surrounding just those components that need to be cleaned, thereby reducing unwanted etching to other components of the beam-line.

An exemplary ion implanter in accordance with the present disclosure may include a beam-line component including a chamber for generation of a plasma, a power supply in communication with the chamber. The power supply may be configured to supply a first voltage and a first current to the beam-line component during a processing mode and a second voltage and a second current to the beam-line component during a cleaning mode, wherein the second voltage and the second current are applied to a plurality of conductive beam optics of the beam-line component, in parallel, to generate a plasma around the plurality of conductive beam optics.

An exemplary system in accordance with the present disclosure may include a beam-line component including a chamber for generation of a plasma, wherein the beam-line component includes a plurality of conductive beam optics disposed along an ion beam-line. The system may further include a power supply in communication with the chamber, the power supply configured to supply a first voltage and a first current to the beam-line component during a processing mode and a second voltage and a second current to the beam-line component during a cleaning mode. The second voltage and the second current may be applied to one or more of the plurality of conductive beam optics, in parallel, to generate a plasma around the one or more of the plurality of conductive beam optics. The system may further include a flow controller for adjusting an injection rate of an etchant gas supplied to the beam-line component, and a vacuum pump for adjusting a pressure of the beam-line component.

An exemplary method in accordance with the present disclosure may include providing a beam-line component including a chamber for generation of a plasma, and supplying a first voltage and a first current to the beam-line component during a processing mode. The method may further include supplying a second voltage and a second current to the beam-line component during a cleaning mode, wherein the second voltage and the second current are applied to a plurality of conductive beam optics of the beam-line component, in parallel, to selectively generate a plasma around the conductive beam optics.

BRIEF DESCRIPTION OF THE DRAWINGS

FIG. 3 is a side cross-sectional view illustrating ion beam optics of the ion beam-line system shown in FIG. 1 in a processing mode.

FIG. 4 is a side cross-sectional view illustrating ion beam optics of the ion beam-line system shown in FIG. 1 in a cleaning mode.

Figure 1:
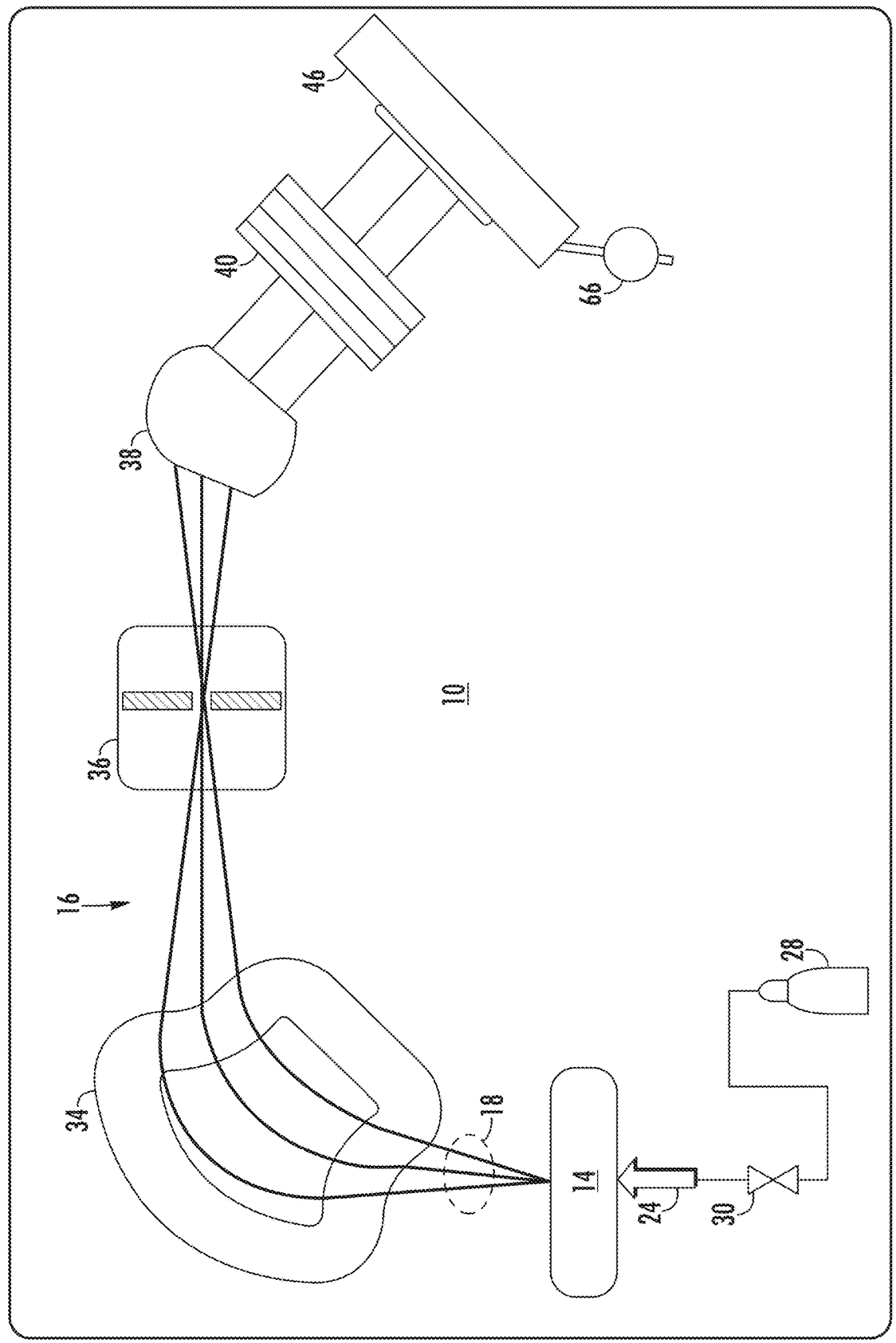
FIG. 1 is an isometric view illustrating an ion beam-line system in accordance with the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method, however, may be embodied in many different forms and should not be construed as being limited to the embodiments set forth herein. Rather, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments also incorporating the recited features.

As stated above, provided herein are approaches for in-situ plasma cleaning of components of an ion implantation system and/or within a process chamber. In one approach, a system includes a component operable with a chamber for generation of a plasma. The system further includes a power supply for supplying a first voltage and first current to the component during a processing mode and a second voltage and second current to the component during a cleaning mode. The second voltage and current are applied to a conductive line optic of the component to selectively generate plasma around the conductive beam optics. The system may further include a flow controller for adjusting an injection rate of an etchant gas supplied to the beam-line component, and a vacuum pump for adjusting pressure of the component. By optimizing the pressure and the injection rate, a more controlled distribution of the plasma around the component may be achieved, which increases overall etching accuracy.

Referring now to FIG. 1, an exemplary embodiment demonstrating a system 10 for performing in-situ plasma cleaning of one or more components of the system in accordance with the present disclosure is shown. The system 10 represents a process chamber containing, among other components, an ion implanter and a series of beam-line components 16 through which an ion beam 18 passes. An ion source 14 may comprise a chamber that receives a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and an energy purity module (EPM) 40, which corresponds to a second acceleration or deceleration stage. Although described hereinafter with respect to the EPM 40 of the beam-line components 16 for the sake of explanation, it will be appreciated that the embodiments described herein for in-situ plasma cleaning are applicable to virtually any component or surface of the system 10.

The beam-line components 16 may filter, focus, and manipulate ions or the ion beam 18 to have a desired species, shape, energy, and other qualities. The ion beam 18 passing through the beam-line components 16 may be directed toward a substrate that is mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species that may be introduced into the substrate in the form of ions. Meanwhile, the additional material may include diluent, which may be introduced into the ion source chamber of the ion source 14 along with the source material to dilute the concentration of the source material in the chamber of the ion source 14. The additional material may also include a cleaning agent (e.g., an etchant gas) that may be introduced into the chamber of the ion source 14 and transported within the system 10 with or without the source material to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize that the above species are not exhaustive, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate by which the source and/or the additional material is provided into the system 10, a flowrate controller 30 may be provided.

The EPM 40 is a beam-line component configured to independently control deflection, deceleration, and focus of the ion beam 18. As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at each point along the central ion beam trajectory for independently controlling deflection, deceleration, and/or focus of an ion beam.

Figure 2A:
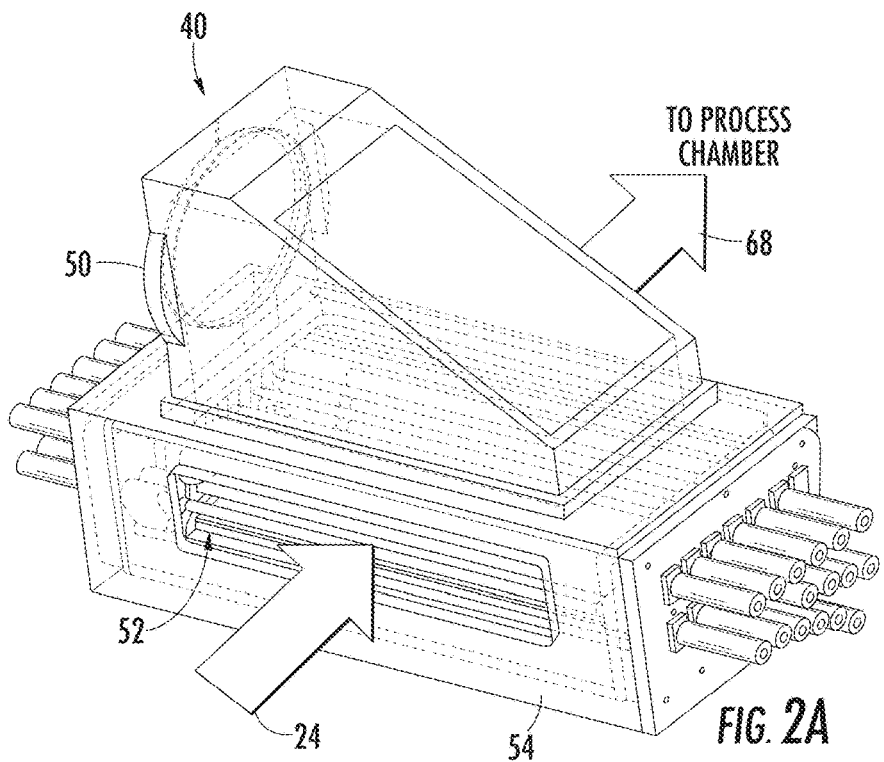
FIG. 2A is a semi-transparent isometric view illustrating a chamber of the ion beam-line system shown in FIG. 1.
Figure 2B:
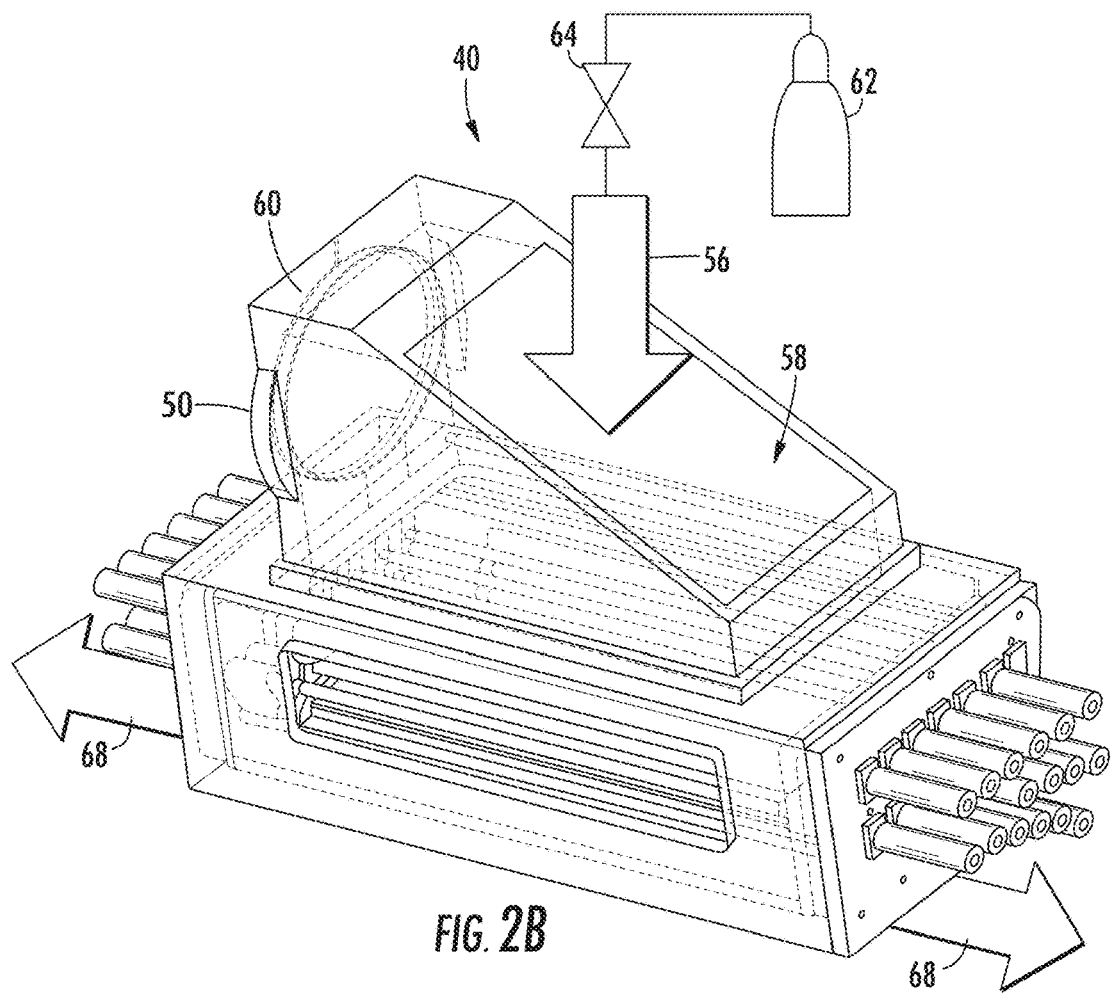
FIG. 2B is a semi-transparent isometric view illustrating a chamber of the ion beam-line system shown in FIG. 1.

Referring now to FIGS. 2A-B, the EPM 40 according to exemplary embodiments will be described in greater detail. As shown, the EPM 40 includes an EPM chamber 50, which extends above and encases EPM 40. The EPM chamber 50 is configured to receive a gas and generate a plasma therein. In one embodiment, as shown in FIG. 2A, EPM chamber 50 may receive a flow of the gas 24 (FIG. 1) from the ion source 14 at a gas inlet 52 through a sidewall 54. In another embodiment, as shown in FIG. 2B, EPM chamber 50 may receive a flow of gas 56 at a gas inlet 58 through a top section 60 of the EPM chamber 50. The gas 56 may be supplied from a supplementary gas source 62 separate from the flow of gas 24 from the ion source 14. In this embodiment, an injection rate of the gas 56 into the EPM chamber 50 may be controlled by a flow controller 64 (e.g., a valve).

EPM 40 further operates with one or more vacuum pumps 66 (FIG. 1) to adjust a pressure of the EPM chamber 50. In exemplary embodiments, the vacuum pump 66 is coupled to the process chamber 46 (FIG. 1), and pressure is adjusted within the EPM chamber 50 through one or more conduits 70. In another embodiment however, the EPM 40 may include one or more additional pumps more closely coupled to the EPM chamber 50.

Referring now to FIGS. 3-4, an exemplary embodiment demonstrating the structure and operation of the EPM 40 in accordance with the present disclosure is shown. The EPM 40 includes one or more conductive beam optics 70A-N, which may include a plurality of graphite electrode rods disposed along an ion beam-line/trajectory 72, as shown. In this embodiment, the conductive beam optics 70A-N are arranged in a symmetrical configuration, wherein the conductive beam optics 70A-B represent a set of entrance electrodes, the conductive beam optics 70C-D represent a set of exit electrodes, and the remaining beam optics 70E-N represent several sets of suppression/focusing electrodes. In another embodiment, the conductive beam optics 70A-N may be arranged in an asymmetrical configuration. As shown, each set of electrode pairs provides a space/gap to allow the ion beam (e.g., a ribbon beam) to pass therethrough. The conductive beam optics 70A-N are provided in a housing 74. As described above, the vacuum pump 66 may be directly or indirectly connected to the housing 74 for adjusting a pressure of an environment 68 therein.

In exemplary embodiments, the conductive beam optics 70A-N include pairs of conductive pieces electrically coupled to each other. Alternatively, the conductive beam optics 70A-N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the conductive beam optics 70A-N are depicted as seven (7) pairs (e.g., with five (5) sets of suppression/focusing electrodes), it should be appreciated that any number of elements (or electrodes) may be utilized. For example, the configuration of conductive beam optics 70A-N may utilize a range of three (3) to ten (10) electrode sets.

In some embodiments, the ion beam passing through the electrodes along the ion beam-line 72 may include boron or other elements. Electrostatic focusing of the ion beam may be achieved by using several thin electrodes (e.g., the suppression/focusing electrodes of conductive beam optics 70E-N) to control grading of potential along the ion beam-line 72. In the configuration of conductive beam optics 70A-N shown, high deceleration ratios may also be provided while avoiding over-focusing. As a result, use of input ion beams may be used in an energy range that may enable higher quality beams, even for very low energy output beams. In one non-limiting example, as the ion beam passes through the electrodes of the conductive beam optics 70A-N, the ion beam may be decelerated from 6 keV to 0.2 keV and deflected at 15°. In this non-limiting example, the energy ratio may be 30/1.

It should be appreciated that separating and independently controlling deceleration, deflection, and/or focus may be accomplished by: (1) maintaining symmetry of the conductive beam optics 70A-N with respect to a central ray trajectory ("CRT") of the ion beam, and (2) varying deflection voltages along the CRT of the ion beam to reflect beam energy at each point along the CRT at a deflection angle. Symmetry of the electrodes with respect to the CRT of the ion beam is where the ends of upper and lower electrodes closest to the ion beam may be maintained at equal (or near equal) perpendicular distances from the CRT of the ion beam.

As noted above, one cause of degradation to the system 10 may be excessive accumulation of deposits or by-products generated by the beam constituents during use. For example, deposits may accumulate on the conductive beam optics 70A-N of the EPM 40, as well as on other components of the system (FIG. 1). In some embodiments, this accumulation of material may be more severe when carborane, $SiF_4$ or $GeF_4$ is used as the source material. To prevent excessive accumulation, the system 10 of the present embodiment may operate in two modes: a processing mode and a cleaning mode. During the processing mode, the system 10 may operate normally to produce the ion beam 18. During the cleaning mode, the EPM 40, or any other component of the system 10, such as beam-line components 16, may be in situ cleaned.

Referring again to FIG. 3, the EPM 40 operating under the processing mode according to one embodiment of the present disclosure is shown. During the processing mode, a power supply 76 (e.g., a DC power supply) supplies a first voltage and a first current to the EPM 40 or, more specifically, to conductive beam optics 70A-N, to generate a plasma within the EPM chamber 50 (FIGS. 2A-B). In various embodiments, the voltage and current provided by the power supply 76 may be constant or varied. In one embodiment, the conductive beam optics 70A-N are held at a series of DC potentials from 0.1 keV-100 keV.

Referring again to FIG. 4, the EPM 40 operating under the cleaning mode according to one embodiment of the present disclosure is shown. In this embodiment, the EPM 40 is switched from the processing mode to the cleaning mode. The system 10 may include a relay switch (not shown) for switching between the processing mode and the cleaning mode so as to avoid having to manually switch power cables. In one embodiment, switching from the processing mode to the cleaning mode is performed automatically, for example, in the case that a predetermined threshold (e.g., a set number of beam glitches) is achieved. In another embodiment, the switching can be triggered by an operator.

During the cleaning mode, a second voltage and a second current are supplied to the conductive beam optics 70A-N of the EPM 40. In one embodiment, the conductive beam optics 70A-N may be electrically driven in parallel (i.e., individually) or in series to enable uniform and/or independent cleaning of the electrodes. The second voltage and the second current may be supplied by the DC power supply 76, or by a radio frequency (RF) power supply 80. Switching from the DC power supply 76 of the processing mode to the RF power supply 80 during the cleaning mode minimizes disruptive arcing that may occur during the cleaning cycle.

In exemplary embodiments, the EPM 40 may be in situ cleaned during the cleaning mode. To accomplish this, an etchant gas (e.g., gas 24, 56 shown in FIGS. 3A-B, respectively) may be introduced into the EPM 40 at a given flow/injection rate. For example, the etchant gas may be introduced at a flow rate of about 25 standard cubic centimeters per minute (SCCM) to about 200 SCCM. Preferably, the etchant gas may be introduced at about 50 SCCM to about 100 SCCM to maintain high pressure flow around the conductive beam optics 70A-N.

Various species may be introduced as the cleaning agent of the etchant gas. The cleaning agent may be atomic or molecular species containing chemically reactive species. Such species, when ionized, may chemically react with the deposits accumulated on the conductive beam optics 70A-N. Although a cleaning agent with chemically reactive species will be described herein, the present disclosure does not preclude utilizing chemically inert species. In another embodiment, the cleaning agent may contain heavy atomic species which, when ionized, may form ions with high atomic mass units (amu). Non-limiting examples of the cleaning agent may include atomic or molecular species containing H, He, N, O, F, Ne, Cl, Ar, Kr, and Xe, or a combination thereof. Preferably, $NF_3$, $O_2$, or a mixture of Ar and $F_2$, or a combination thereof, may be used as the cleaning agent.

The composition of the etchant gas can be chosen to optimize chemical etching based on a composition of the deposit(s) formed on the conductive beam optics 70A-N. For example, fluorine-based plasmas may be used to etch beam components containing B, P, and As, while oxygen-based plasmas may be used to etch photoresist. In one embodiment, by adding Ar or other heavy species to the plasma mixture, increased ion bombardment can help further improve the removal rate of the deposit(s) from the conductive beam optics 70A-N using a chemically enhanced ion sputtering process. Plasma or ion bombardment also provokes heating of the surfaces to aid chemical etch rates and help volatilize the deposit(s) from the surface of the conductive beam optics 70A-N.

Figure 5A:
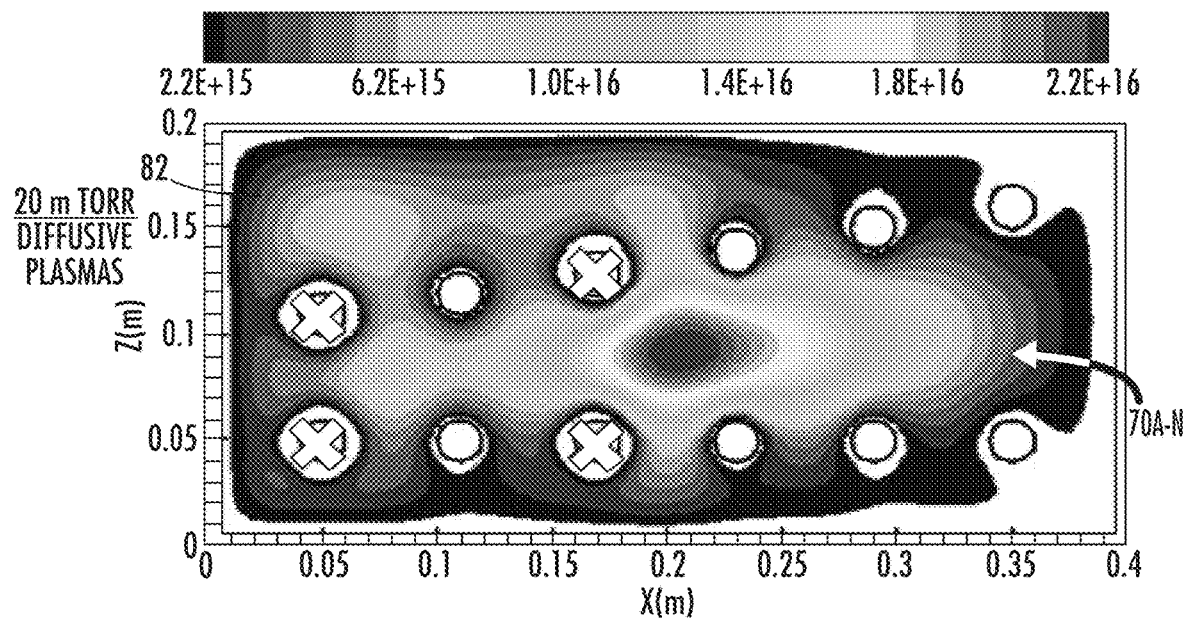
FIG. 5A is an illustration of plasma generation around the ion beam optics of the ion beam-line system shown in FIG. 1.
Figure 5B:
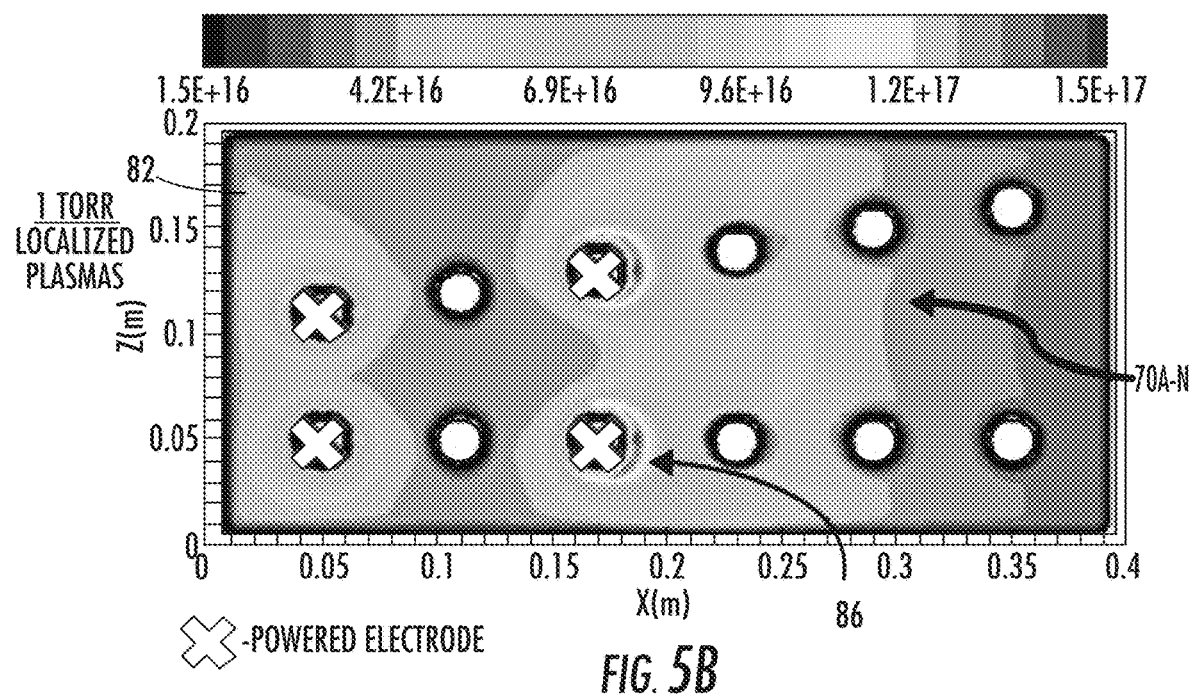
FIG. 5B is an illustration of plasma generation around the ion beam optics of the ion beam-line system shown in FIG. 1.

Referring now to FIGS. 4 and 5A-5B, generation of a plasma 82 within the EPM 40 according to exemplary embodiments is shown. In the present embodiment, the plasma 82 may be created in the volume defined by the housing 74 by providing continuous or pulsed AC/DC voltage to the graphite electrodes of the conductive beam optics 70A-N. For example, about 400 V to 1 kV at about 1 A to about 5 A of current may be supplied to the conductive beam optics 70A-N using the DC power supply 76 or the RF power supply 80. The power may be in the form of AC voltage or pulsed DC voltage to the conductive beam optics 70A-N. As stated above, each of the conductive beam optics 70A-N may be driven in parallel to enable independent and selective generation of the plasma 82.

To increase the density and localization of the plasma 82 within the EPM 40, a pressure within the EPM 40 is increased. Specifically, as shown in FIGS. 5A-B, by increasing the pressure set point for the cleaning process, either by increasing the gas injection rate or reducing the pump rate to the EPM 40, the plasma 82 is localized around those electrode rods that are powered (indicated by an 'X'). For example, the plasma distribution shown in FIG. 5-A demonstrates a diffusive plasma 82 at 20 mTorr, while the plasma distribution shown in FIG. 5-B demonstrates a localized plasma 82 in an area 86 surrounding the four (4) powered electrode rods at 1 Torr.

Selective plasma generation is useful to minimize the impact of harmful radicals (e.g., fluorine) to other parts of the EPM 40, in order to prevent etching and damaging of heavy metal (e.g., steel) parts. A higher flow rate through the EPM 40 can allow for faster replacement of etch by-products with fresh reactants, producing a more efficient clean process.

Figure 6A:
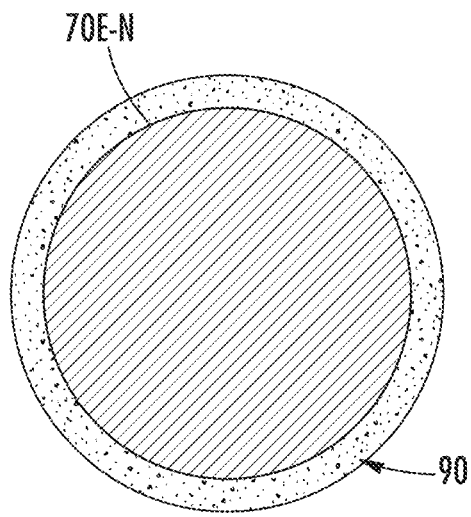
FIG. 6A is an image illustrating accumulation of a deposit on an ion beam optic of the ion beam-line system shown in FIG. 1.
Figure 6B:
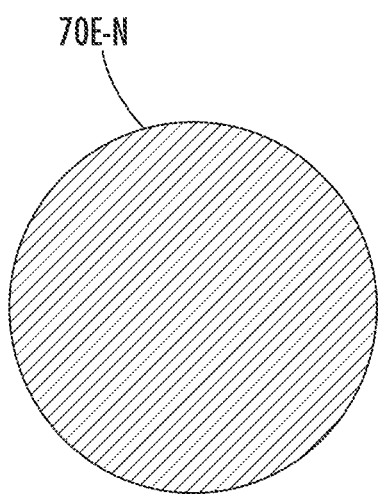
FIG. 6B is an image illustrating the one of the ion beam optics shown in FIG. 6A following removal of the deposit.

Furthermore, by generating the plasma near one or more of the conductive beam optics 70A-N, and supplying the etchant gas to the EPM 40 at an optimized flow rate, the conductive beam optics 70A-N may be cleaned. For example, as shown in FIGS. 6A-B, chemically reactive radicals contained in the plasma 82 may remove deposits 90 accumulated on the surface of one of the conductive beam optics, 70-E, via chemical reaction. In an exemplary embodiment, the conductive beam optic 70-E is a graphite electrode rod containing surface deposits 90 such as Si, Phosphorus, and photoresist, as shown in FIG. 6-A, which are removed by the cleaning process, as shown in FIG. 6-B.

In addition, the ions in the cleaning plasma 82 may remove the accumulated deposit 90 via an ion sputtering process. The heat generated from the cleaning plasma 82 may also enhance the cleaning process as the deposits accumulated on the conductive beam optics 70A-N may be removed by the heat or may become more volatile with increased temperature. For example, as described above, the conductive beam optics 70A-N may be provided with a voltage of between 400 and 1000V at a current of between 1 to 5 amps. Thus, it is possible to generate up to about 5 kW of heat. Thus, by providing highly reactive and/or heavy cleaning species, and generating the plasma 82 near the conductive beam optics 70A-N, effective plasma cleaning may be performed. As noted above, a high flow rate by which the cleaning materials are introduced into the EPM 40 may enhance the cleaning process. This technique, unlike conventional techniques, may be performed in situ, and the system 10 (FIG. 1) of the present disclosure need not power down, and the vacuum of the entire system 10, or a portion of the system 10, may be maintained. This can vary, for example, depending on the gas injection and pumping configurations used, or inclusion of isolation regions. For localized plasma generation, as shown in FIG. 5, the pressure near the optics that are being cleaned is at a lower vacuum state than during the processing mode.

Figure 7:
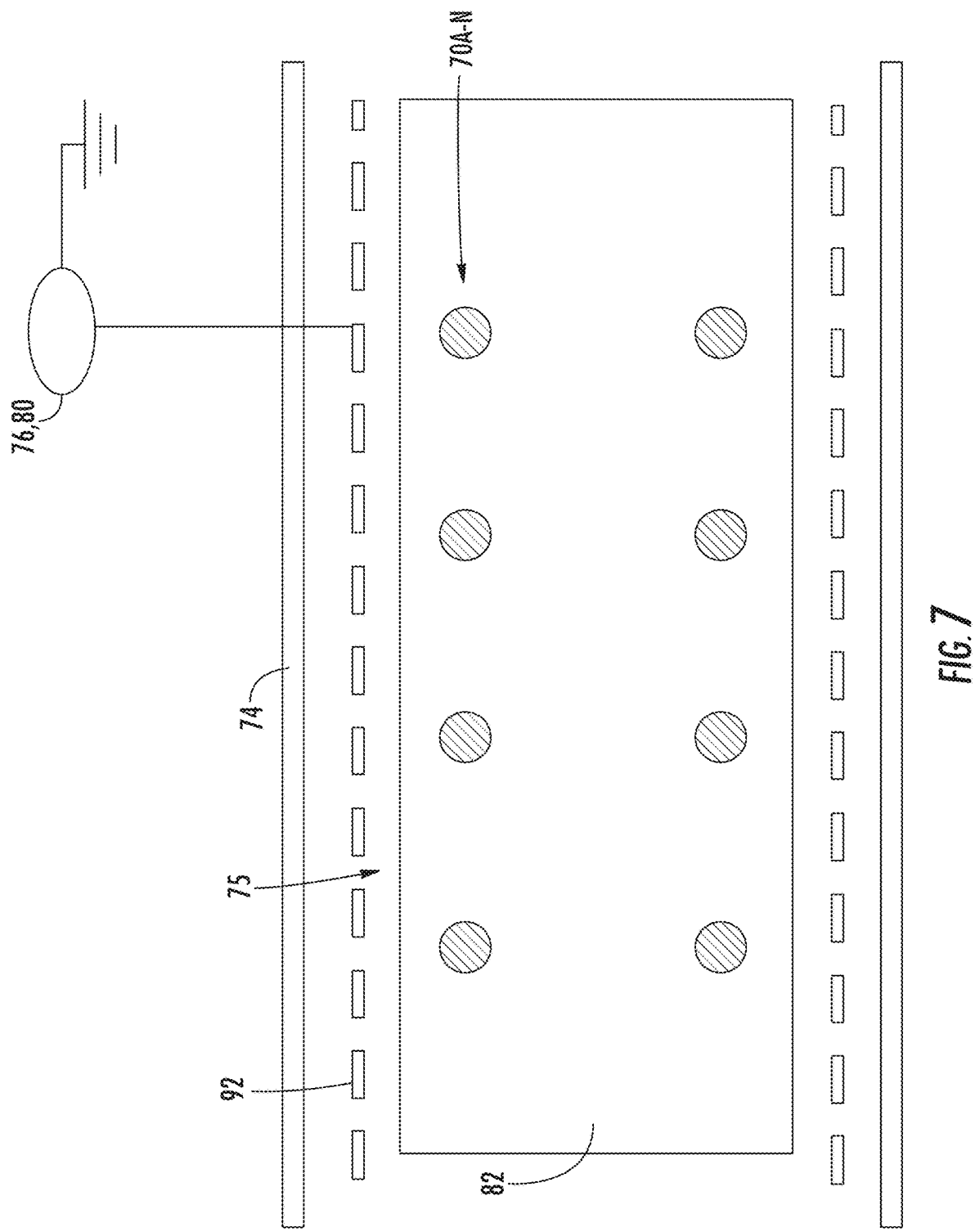
FIG. 7 is a side cross-sectional view of an electrode grid of the ion beam-line system shown in FIG. 1.

Referring now to FIG. 7, a cross-sectional view of the conductive beam optics 70A-N within the housing 74 will be described in greater detail. In this embodiment, during the cleaning mode, the second voltage (DC, AC, RF etc) can also be applied to an electrode grid 92 disposed between the conductive beam optics 70A-N and the housing 74. For example, the electrode grid may be a gridded liner that is grounded during the processing mode, along with the housing 74. The conductive beam optics 70A-N may be at zero volts (or another fixed voltage) with respect the power supplied to the electrode grid 92 during the cleaning mode. When the processing mode is switched to the cleaning mode, the plasma 82 is formed, as shown.

To increase the density and localization of the plasma 82 within the housing 74, a pressure of the environment 68 may be increased. Specifically, by increasing the pressure set point for the cleaning process, either by increasing the gas injection rate or reducing the pump rate to the housing 74, the plasma 82 may be localized around one or more of the conductive beam optics 70A-N.

Figure 8:
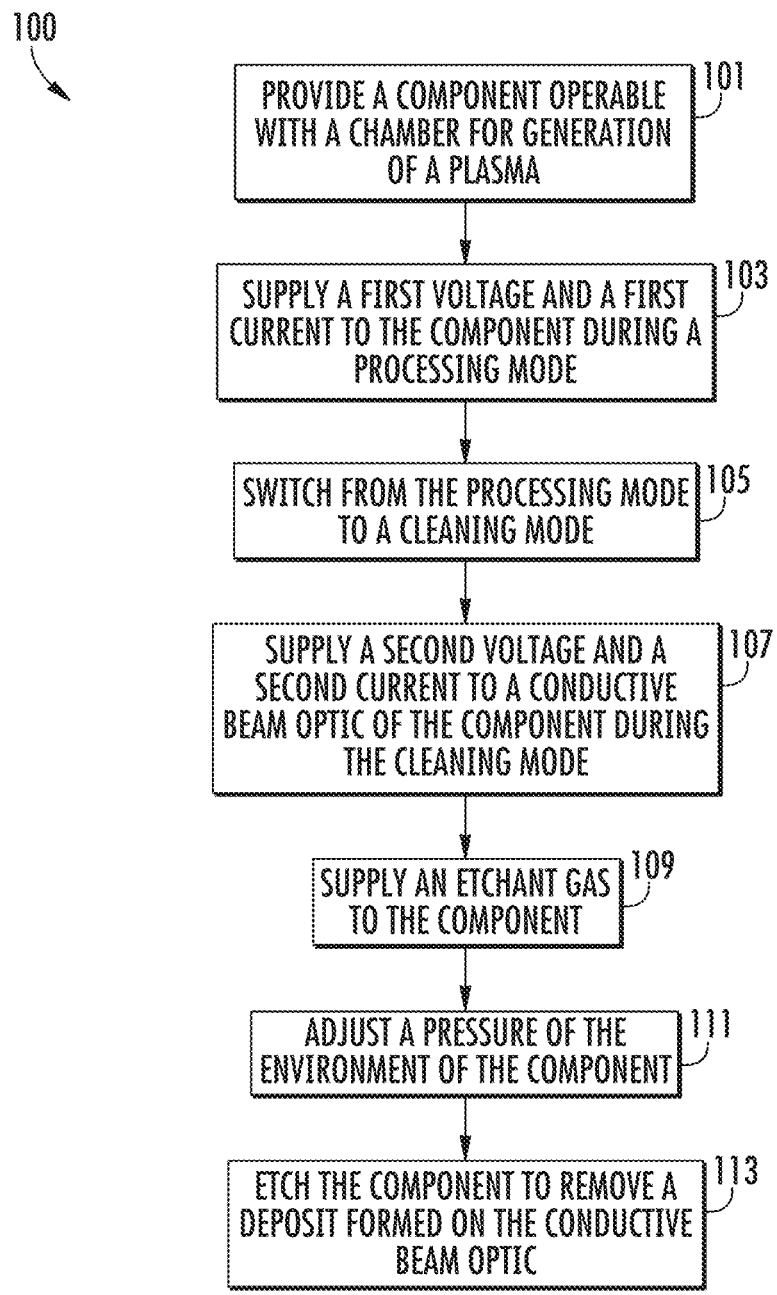
FIG. 8 is a flowchart illustrating an exemplary method according to the present disclosure.

Referring now to FIG. 8, a flow diagram illustrating an exemplary method 100 for in-situ plasma cleaning of ion beam optics in accordance with the present disclosure is shown. The method 100 will be described in conjunction with the representations shown in FIGS. 1-7.

Method 100 includes providing a component operable with a chamber of an ion implanter for generating a plasma, as shown in block 101. In some embodiments, the component is a beam-line component, such as an energy purity module (EPM). In some embodiments, the EPM includes a conductive beam optic. In some embodiments, the EMP includes a plurality of conductive beam optics. In some embodiments, the plurality of conductive beam optics includes a plurality of electrode rods.

Method 100 further includes supplying a first voltage and a first current to the component during a processing mode, as shown in block 103. In some embodiments, a first voltage and a first current are supplied by a direct current (DC) power supply.

The method 100 further includes switching from the processing mode to a cleaning mode, as shown in block 105. In some embodiments, the method 100 includes automatically switching from the processing mode to the cleaning mode in the case that a predetermined threshold is achieved, e.g., a maximum acceptable number of beam glitches.

Method 100 further includes supplying a second voltage and a second current to the component during a cleaning mode, as shown in block 107. In some embodiments, the second voltage and the second current are applied to a conductive beam optic of the component to generate a plasma around the conductive beam optic. In some embodiments, the second voltage and the second current are supplied from a direct current (DC) power supply or a radio frequency (RF) power supply.

Method 100 further includes supplying an etchant gas to the beam-line component to enable etching of the plurality of conductive beam optics, as shown in block 109. In some embodiments, an injection rate of the etchant gas is adjusted. In some embodiments, a composition of the etchant gas is selected to optimize etching of the component based on a composition of the deposit formed thereon.

Method 100 further includes adjusting a pressure of an environment of the component, as shown in block 111. In some embodiments, the pressure supplied to the component is increased to localize the plasma in an area surrounding one or more of the conductive beam optics.

Method 100 further includes etching the component to remove a deposit formed on the conductive beam optic during the processing mode, as shown in block 113. In some embodiments, the conductive beam optic is etched using an ion sputtering process.

In view of the foregoing, at least the following advantages are achieved by the embodiments disclosed herein. Firstly, the in-situ plasma cleaning may be performed over a short time and without having to vent and/or manually clean the component. Secondly, during in-situ plasma cleaning the plasma density is greater surrounding those components that are to be cleaned, thereby reducing unwanted etching to other components of the beam-line and/or the system.

While certain embodiments of the disclosure have been described herein, the disclosure is not limited thereto, as the disclosure is as broad in scope as the art will allow and the specification may be read likewise. Therefore, the above description are not to be construed as limiting, but merely as exemplifications of particular embodiments. Those skilled in the art will envision other modifications within the scope and spirit of the claims appended hereto.

What is claimed is:

1. A method, comprising:
   providing an electrode grid and a plurality of conductive beam optics within an electrostatic filter, wherein the electrode grid is disposed above and below an ion beamline, between the plurality of conductive beam optics and a housing of the electrostatic filter;
   supplying, from a power supply, a first voltage and a first current to the plurality of conductive beam optics during a processing mode; and
   supplying a second voltage and a second current to the electrode grid during a cleaning mode to generate a plasma around one or more of the conductive beam optics, wherein the electrode grid is grounded during the processing mode and supplied the second voltage during the cleaning mode, and wherein the plurality of conductive beam optics is at zero volts during the cleaning mode.

2. The method of claim 1, further comprising supplying an etchant gas to the electrostatic filter to enable cleaning of the plurality of conductive beam optics.

3. The method of claim 2, further comprising adjusting an injection rate of the etchant gas using a flow controller.

4. The method of claim 1, further comprising arranging electrode grid parallel to the ion beamline.

5. The method of claim 1, further comprising adjusting a pressure of the chamber using a vacuum pump.

6. The method of claim 1, further comprising supplying the second voltage and the second current from one of the following: a direct current (DC) power supply, and a radio frequency (RF) power supply.

7. The method of claim 6, further comprising switching from the processing mode to the cleaning mode, wherein the first voltage and the first current are supplied by the DC power supply.

8. The method of claim 1, further comprising etching, during the cleaning mode, a deposit formed on one or more of the conductive beam optics.

9. A method comprising:
providing an electrode grid and a plurality of conductive beam optics within a chamber of an electrostatic filter, wherein the electrode grid extends parallel to, and is disposed above and below, an ion beamline;
supplying, from a power supply, a first voltage and a first current to the plurality of conductive beam optics during a processing mode;
supplying a second voltage and a second current to the electrode grid during a cleaning mode to generate a plasma around one or more of the conductive beam optics, wherein the electrode grid is grounded during the processing mode, and wherein the plurality of conductive beam optics is at zero volts during the cleaning mode; and
etching, during the cleaning mode, a deposit formed on one or more of the conductive beam optics.

10. The method of claim 9, further comprising adjusting an injection rate of the etchant gas using a flow controller.

11. The method of claim 9, further comprising providing the electrode grid directly adjacent the plurality of conductive beam optics and a housing defining the chamber of an electrostatic filter.

12. The method of claim 9, further comprising increasing a pressure of the chamber using a vacuum pump.

13. The method of claim 9, further comprising supplying the second voltage and the second current from one of the following: a direct current (DC) power supply, and a radio frequency (RF) power supply.

14. The method according to claim 9, further comprising automatically switching from the processing mode to the cleaning mode in the case a predetermined threshold of ion beam glitches is achieved.

15. A method comprising:
providing an electrode grid and a plurality of conductive beam optics within a chamber of an electrostatic filter, wherein the electrode grid extends parallel to, and is disposed above and below, an ion beamline passing through the plurality of conductive beam optics, and wherein the electrode grid is directly adjacent the conductive beam optics and a housing of the electrostatic filter;
supplying, from a power supply, a first voltage and a first current to the plurality of conductive beam optics during a processing mode; and
supplying a second voltage and a second current to the electrode grid during a cleaning mode to generate a plasma around one or more of the conductive beam optics, wherein the electrode grid is grounded during the processing mode, and wherein the plurality of conductive beam optics is at zero volts during the cleaning mode.

16. The method of claim 15, further comprising etching, during the cleaning mode, a deposit formed on one or more of the conductive beam optics.

* * * * *